(12) United States Patent
Murata et al.

(10) Patent No.: US 8,237,218 B2
(45) Date of Patent: Aug. 7, 2012

(54) NONVOLATILE SEMICONDUCTOR MEMORY DEVICE AND METHOD OF MANUFACTURING THE SAME

(75) Inventors: Takeshi Murata, Kawasaki (JP); Takeshi Kamigaichi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/226,224

(22) Filed: Sep. 6, 2011

(65) Prior Publication Data

US 2011/0316065 A1 Dec. 29, 2011

Related U.S. Application Data

(62) Division of application No. 12/434,305, filed on May 1, 2009, now Pat. No. 8,026,546.

(30) Foreign Application Priority Data

May 9, 2008 (JP) ................................ 2008-123023

(51) Int. Cl.
*H01L 29/792* (2006.01)
(52) U.S. Cl. ................ 257/326; 257/4; 257/5; 257/315; 365/185.06; 365/185.26
(58) Field of Classification Search .................. 257/326, 257/4, 5, 315; 365/185.06, 185.26
See application file for complete search history.

(56) References Cited

U.S. PATENT DOCUMENTS

| | | | |
|---|---|---|---|
| 7,952,136 B2 | 5/2011 | Kito et al. | 257/326 |
| 2006/0049449 A1 | 3/2006 | Iino et al. | |
| 2006/0091556 A1 | 5/2006 | Shigeoka | |
| 2006/0197115 A1 | 9/2006 | Toda | 257/248 |
| 2007/0128815 A1 | 6/2007 | Iino et al. | |
| 2007/0158736 A1 | 7/2007 | Arai et al. | |
| 2008/0173928 A1 | 7/2008 | Arai et al. | |
| 2008/0173932 A1 | 7/2008 | Kidoh et al. | |
| 2008/0217600 A1 | 9/2008 | Gidon | 257/4 |
| 2008/0265235 A1 | 10/2008 | Kamigaichi et al. | 257/2 |

FOREIGN PATENT DOCUMENTS

JP 2007-180389 7/2007

OTHER PUBLICATIONS

H. Tanaka, et al., "Bit Cost Scalable Technology with Punch and Plug Process for Ultra High Density Flash Memory", 2007 Symposium on VLSI Technology Digest of Technical Papers, 2007, 1 Page.

*Primary Examiner* — Zandra Smith
*Assistant Examiner* — Errol Fernandes
(74) *Attorney, Agent, or Firm* — Oblon, Spivak, McClelland, Maier & Neustadt, L.L.P.

(57) ABSTRACT

A nonvolatile semiconductor memory device includes a first stack unit with a first selection transistor and a second selection transistor formed on a semiconductor substrate and a second stack unit with first insulating layers and first conductive layers stacked alternately on the upper surface of the first stack unit. The second stack unit includes a second insulating layer formed in contact with side walls of the first insulating layer and the first conductive layer, a charge storage layer formed in contact with the second insulating layer for storing electrical charges, a third insulating layer formed in contact with the charge storage layer, and a first semiconductor layer formed in contact with the third insulating layer so as to extend in a stacking direction, with one end connected to one diffusion layer of the first selection transistor and the other end connected to a diffusion layer of the second selection transistor.

6 Claims, 18 Drawing Sheets

NONVOLATILE SEMICONDUCTOR MEMORY DEVICE AND METHOD OF MANUFACTURING THE SAME

CROSS REFERENCE TO RELATED APPLICATIONS

This application is a divisional of application Ser. No. 12/434,305, filed May 1, 2009 and claims the benefit of priority from prior Japanese Patent Application No. 2008-123023, filed on May 9, 2008, the entire contents of which are incorporated herein by reference.

BACKGROUND OF THE INVENTION

1. Field of the Invention

The invention relates to a nonvolatile semiconductor memory device in which data is electrically rewritable and a method of manufacturing the same.

2. Description of the Related Art

An EEPROM (Electrically Erasable Programmable Read Only Memory) which writes and erases data electrically has been hitherto known as a nonvolatile semiconductor memory device. Further, a NAND-type flash memory which can be highly integrated has been known as one of the EEPROM. The memory cell of the NAND-type flash memory has a layer for the purpose of electrical charge storage and stores data by difference of threshold voltage according to the charge amount in the charge storage layer.

Recently, there is known the structure of providing memory cells stacked in a vertical direction to a substrate surface and providing a selection transistor above and below the memory cells (refer to Japanese Patent Application Laid-Open No. 2007-180389) in order to improve the recording density of a nonvolatile semiconductor memory device.

Generally, a plurality of memory cells are connected in series, sharing a source/drain diffusion layer, to form a NAND cell unit in the NAND-type flash memory. In the case of arranging the memory cells and the selection transistors in a vertical direction, the channel region of the selection transistors may be formed of polycrystal silicon or microcrystal silicon similarly to the memory cell. The selection transistor having the channel portion of the polycrystal silicon or the microcrystal silicon has an electrical property inferior to that having the channel portion of the single crystal silicon in a cut off characteristics, an on-current, an operation speed and so on. In the NAND-type flash memory of a stack structure, a good cut off characteristics is necessary in the selection transistors at the both ends (or one end) of the memory cells connected in series. Therefore, there is the case where the selection transistor having the channel portion of polycrystal silicon or microcrystal silicon cannot fill a necessary specification.

SUMMARY OF THE INVENTION

A nonvolatile semiconductor memory device according to one aspect of the invention includes: a first stack unit with a first selection transistor and a second selection transistor formed on a semiconductor substrate; and a second stack unit with a first insulating layer and a first conductive layer alternately stacked on the upper surface of the first stack unit, the second stack unit including a second insulating layer formed in contact with side walls of the first insulating layer and the first conductive layer, a charge storage layer formed in contact with the second insulating layer for storing electrical charges, a third insulating layer formed in contact with the charge storage layer, and a first semiconductor layer formed in contact with the third insulating layer so as to extend in a stacking direction, with one end connected to one diffusion layer of the first selection transistor and the other end connected to a diffusion layer of the second selection transistor.

A nonvolatile semiconductor memory device according to another aspect of the invention has a plurality of NAND cell units formed of a plurality of electrically rewritable memory cells connected in series and the first selection transistor and the second selection transistor connected to both ends of the memory cells, respectively, the NAND cell unit being formed by connecting a plurality of vertical-typed memory cells in a stacking direction, the memory cells having a channel region formed in a direction vertical to a surface of a substrate, the first selection transistor and the second selection transistor being formed on a semiconductor substrate, the channel region of the memory cell being formed by the first semiconductor layer formed so as to extend in the stacking direction with one end connected to a diffusion layer of the first selection transistor and the other end connected to a diffusion layer of the second selection transistor, and the first semiconductor layer having an inverted U-shaped cross sectional shape in a way of turning back at an upper portion in the stacking direction and contacting the first selection transistor and the second selection transistor at a lower portion.

A method of manufacturing a nonvolatile semiconductor memory device according to another aspect of the invention includes: forming a first selection transistor and a second selection transistor on a semiconductor substrate; depositing a plurality of first insulating layers and a plurality of first conductive layers alternately on the upper surface of the first selection transistor and the second selection transistor; forming a first opening by piercing the stacked first insulating layers and first conductive layers; stacking a second insulating layer, a charge storage layer of storing electrical charges, and a third insulating layer by turns on a side surface of the first insulating layers and the first conductive layers facing the first opening; and forming a first semiconductor layer of first conductive type in contact with the third insulating layer in a way of extending in a stacking direction; the first semiconductor layer being formed in a way that one end is connected to a diffusion layer of the first selection transistor and the other end is connected to a diffusion layer of the second selection transistor.

DETAILED DESCRIPTION OF THE EMBODIMENTS

An embodiment of the invention will be described below referring to the attached drawings. In the following embodiment, "n+ type" shows a semiconductor having a high concentration of N-type impurity and "n− type" shows a semiconductor having a low concentration of N-type impurity. Similarly, "p+ type" shows a semiconductor having a high concentration of p-type impurity and "p− type" shows a semiconductor having a low concentration of p-type impurity.

(Circuit Configuration of Nonvolatile Semiconductor Memory Device)

Figure 1:
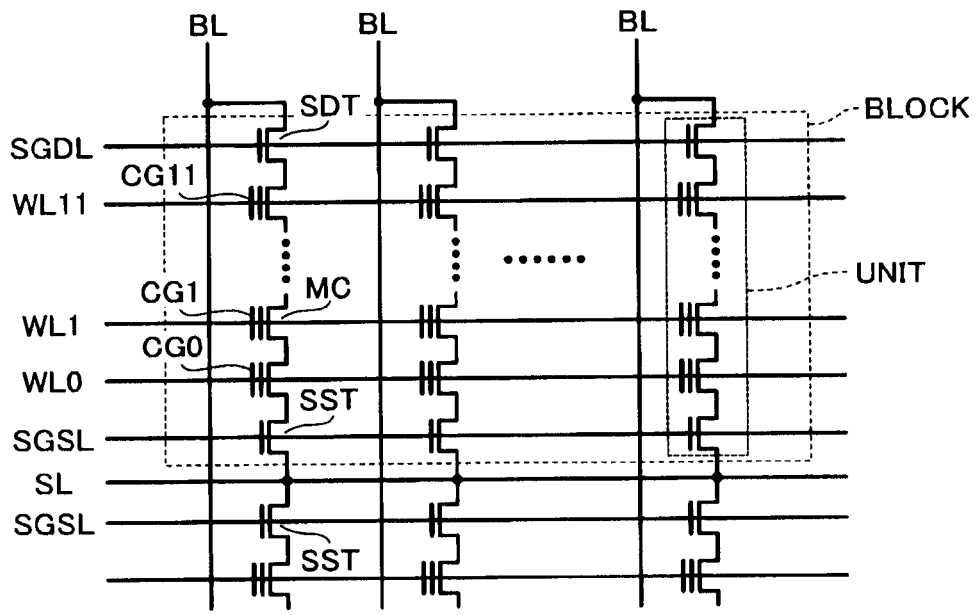
FIG. 1 is a circuit diagram of a nonvolatile semiconductor memory device according to an embodiment of the invention.

FIG. 1 is a circuit diagram of a nonvolatile semiconductor memory according to the embodiment of the invention. The nonvolatile semiconductor memory device according to the embodiment is a so-called NAND-type flash memory.

As shown in FIG. 1, one unit that is a unit of data erase is formed by a plurality of memory cells MC connected in series, a source side selection transistor SST connected to one end (source side) of the memory cells MC in series, and a drain side selection transistor SDT connected to the other end (drain side) in series. In the example shown in FIG. 1, twelve memory cells MC are connected in series. Although the number of the memory cells MC is twelve in FIG. 1, it may be the other number.

Word lines WL0 to WL11 are respectively connected to control gates CG0 to CG11 of the memory cell transistors as the memory cells MC. A source side select gate line SGSL is connected to a gate terminal of the source side selection transistor SST. A source line SL is connected to the source terminal of the source side selection transistor SST. A drain side select gate line SGDL is connected to the gate terminal of the drain side selection transistor SDT. A bit line BL is connected to the drain terminal of the drain side selection transistor SDT.

The source side select gate line SGSL and the drain side select gate line SGDL are used to control on/off of the selection transistors SST and SDT. At a time of data writing and data reading, the source side selection transistor SST and the drain side selection transistor SDT work as the gate for supplying a certain electrical potential to the memory cells MC in the unit.

The block is formed by a plurality of units arranged in a row direction (a direction of extending the word line WL shown in FIG. 1). A plurality of memory cells MC connected to the same word line WL in one block is treated as one page, and writing and reading operations are performed on each page. A plurality of blocks are arranged in a column direction (the direction of extending the bit line BL in FIG. 1).

(Concrete Constitution of Nonvolatile Semiconductor Memory Device)

Figure 2A:
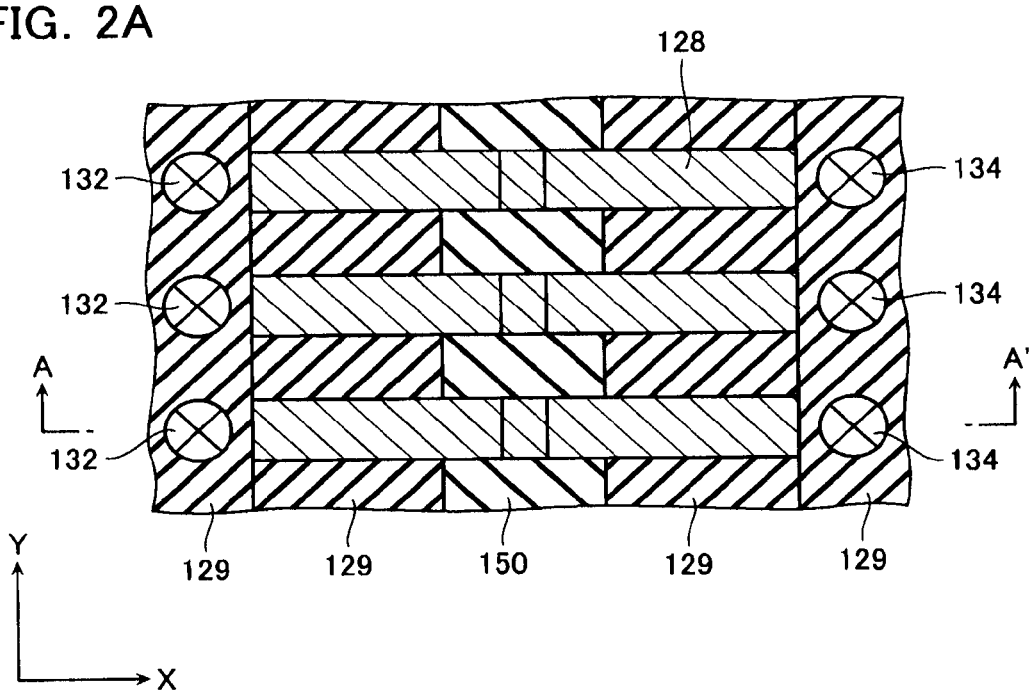
FIG. 2A is a top plan view showing a concrete constitution of the nonvolatile semiconductor memory device according to the embodiment of the invention.
Figure 2B:
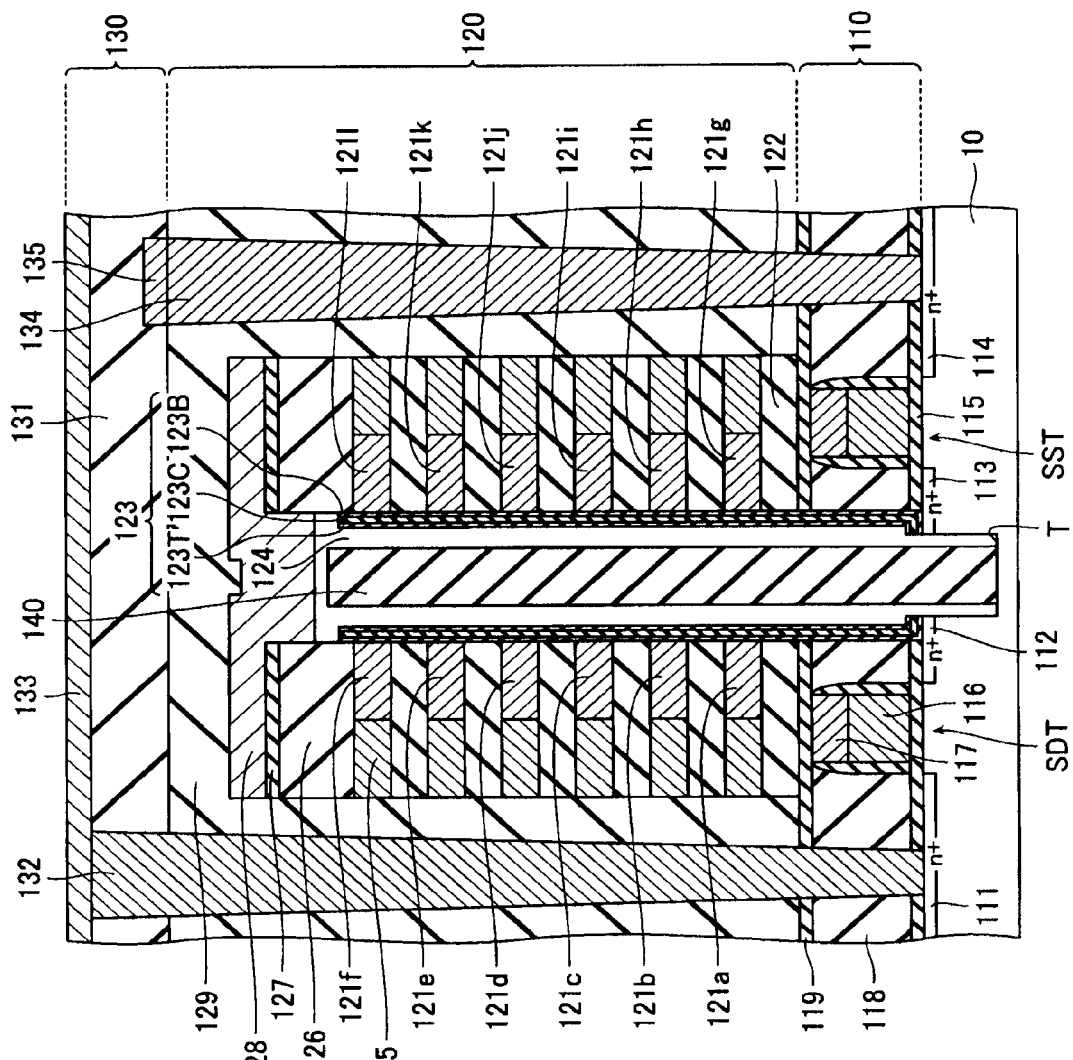
FIG. 2B is a cross-sectional view of A-A' in FIG. 2A showing the concrete constitution of the nonvolatile semiconductor memory device according to the embodiment of the invention.

Next, a concrete constitution of a nonvolatile semiconductor memory according to the embodiment will be described referring to FIGS. 2A and 2B. FIG. 2A is a top plan view of the nonvolatile semiconductor memory device according to the embodiment and FIG. 2B is a cross-sectional view of A-A' in FIG. 2A. In FIG. 2A, the bit line BL (wiring layer 133 described later), the source line SL (wiring layer 135 described later), and the insulating layer 131 described later provided in the upper portion are omitted. In FIGS. 2A and 2B, the direction of extending the above mentioned bit line BL is defined as an X direction and the direction of extending the above mentioned source line SL (wiring layer 134 described later) is defined as a Y direction.

As shown in FIGS. 2A and 2B, the nonvolatile semiconductor memory device according to the embodiment is the NAND-type flash memory having memory cells with a stack structure. The vertical type memory cell transistor is used as the memory cell MC according to the embodiment. The vertical type transistor has a channel formed in the vertical direction (stacking direction) to the surface of the semiconductor substrate.

In the nonvolatile semiconductor memory device, a first stack unit 110 is formed on a semiconductor substrate 10. A second stack unit 120 and a third stack unit 130 are stacked on the first stack unit 110.

The selection transistors SDT and SST (the first selection transistor and the second selection transistor) of the nonvolatile semiconductor memory device are formed in the first stack unit 110. The selection transistors SDT and SST are a planar gate type n channel MOSFET. The selection transistors SDT and SST are formed on the p-type semiconductor substrate 10 having the upper surface and the lower surface facing each other. The semiconductor substrate 10 is formed, for example, of silicon (Si). The p-type semiconductor substrate 10 works as a p-type base region. The n+ type drain regions 111 and 113 and the n+ type source regions 112 and 114 of the respective selection transistors SDT and SST are set on the upper surface of the semiconductor substrate 10.

A gate electrode 116 is formed between the n+ type drain regions 111 and 113, and the n+ type source regions 112 and 114 via a gate insulating film 115 on the p-type semiconductor substrate 10. The gate insulating film 115 is formed, for example, of a silicon oxide ($SiO_2$) film with the film thickness of about 0.1 μm. The gate electrode 116 forms an inversion layer on the p-type semiconductor substrate 10 between the n+ type drain regions 111 and 113 by having a gate voltage more than the threshold applied there, to turn on the selection transistor. A silicide layer 117 is formed on the upper surface of the gate electrode 116. The gate electrode 116 works as the drain side select gate line SGDL of the drain side selection transistor SDT and the source side select gate line SGSL of the source side selection transistor SST.

The bit line BL (wiring layer 133 described later) is electrically connected to the n+ type drain region 111 of the drain side selection transistor SDT via a contact plug layer 132 described later. An n− type semiconductor layer 124 described later is connected to the n+ type source region 112 of the drain side selection transistor SDT. The n− type semiconductor layer 124 is also connected to the n+ type drain region 113 of the source side selection transistor SST. The source line SL (wiring layer 135 described later) is electrically connected to the n+ type source region 114 of the source side selection transistor SST via a contact plug layer 134 described later. The drain side selection transistor SDT and the source side selection transistor SST are insulation-separated by an insulating layer 140. An interlayer insulating layer 118 and an interlayer insulating layer 119 are deposited on the drain side selection transistor SDT and the source side selection transistor SST. The contact plug layers 132 and 134 are isolated from the gate electrode 116 by the interlayer insulating films 118 and 119.

The second stack unit 120 is formed of first conductive layers 121a to 121l and interlayer insulating layer 122 (the first insulating layer) stacked alternately from the bottom layer. The respective first conductive layers 121a to 121l work as the control gates CG0 to CG11 of the above mentioned respective memory cells MC.

The second stack unit 120 has a trench T penetrating the first stack unit 110 and reaching to the semiconductor substrate 10. The above mentioned insulating layer 140 is provided inside the trench T. The insulating layer 140 corresponds to a buried insulating film of a so-called SOI substrate from the relation with the n− type semiconductor layer 124. The second stack unit 120 has a block insulating layer 123B (the second insulating layer), a charge storage layer 123C, a tunnel insulating layer 123T (the third insulating layer), and the n− type semiconductor layer 124 (the first semiconductor layer) on the side surface of the trench T between each of the first conductive layers 121a to 121l and each insulating layer 140.

For example, polysilicon is used for the first conductive layers 121a to 121l. In order to make the resistance of the control gate lower, tungsten (W), aluminum (Al), and copper (Cu) may be used. The first conductive layers 121a to 121l have the silicide layers 125 on the end portion at the side opposite to the block insulating layer 123B.

For example, silicon oxide ($SiO_2$) film is used for the interlayer insulating layer 122. The BPSG (Boron Phosphorus Silicate Glass), the BSG (Boron Silicate Glass), or the PSG (Phosphorus Silicate Glass) including boron (B) or phosphorus (P) in the silicon oxide film may be used.

The block insulating layer 123B is formed in contact with the side walls of the first conductive layers 121a to 121l and the interlayer insulating layer 122. The block insulating layer 123B prevents the electrical charges stored in the charge storage layer 123C from diffusing to the gate electrode (the first conductive layers 121a to 121l). For example, a silicon oxide ($SiO_2$) film or an aluminum oxide ($Al_2O_3$) film may be used as the block insulating layer 123B. The film thickness of the block insulating layer 123B is about 4 nm.

The charge storage layer 123C is formed in contact with the block insulating layer 123B to store the charges. For example, a silicon nitride (SiN) film is used as the charge storage layer 123C. The film thickness of the charge storage layer 123C is about 8 nm.

The tunnel insulating layer 123T is provided in contact with the charge storage layer 123C. The tunnel insulating layer 123T becomes a potential barrier when the electrical charges from the n− type semiconductor layer 124 are stored in the charge storage layer 123C or when the electrical charges stored in the charge storage layer 123C diffuse to the n− type semiconductor layer 124. For example, a silicon oxide ($SiO_2$) film is used as the tunnel insulating layer 123T. The silicon oxide film is superior to the silicon nitride film in insulation quality and its function of preventing the diffusion of the electrical charge is preferable. The film thickness of the tunnel insulating layer 123T is about 4 nm.

That is, the block insulating layer 123B, the charge storage layer 123C, and the tunnel insulating layer 123T form an ONO film (stack film of oxide film, nitride film, and oxide film) 123.

The n− type semiconductor layer 124 has a reversed U-shaped cross section taken along the line A-A', in other words, it turns back in the upper portion of the stacking direction and has two open ends in the lower portion of the stacking direction. The n− type semiconductor layer 124 has a side portion formed in contact with each tunnel insulating layer 123T and extending in the stacking direction (in pillar shape), and a ceiling portion formed to connect together an upper end of the side portion. The lower end of the side portion of the n− type semiconductor layer 124 extends to the first stack unit 110 to be connected to the n+ type source region 112 of the drain side selection transistor SDT and the n+ type drain region 113 of the source side selection transistor SST. The ceiling portion of the n− type semiconductor layer 124 is formed above the upper surfaces of the first conductive layers 121*f* and 121*l*. The n− type semiconductor layer 124 is formed of a semiconductor material, for example, amorphous silicon.

The interlayer insulating layer 126 and the interlayer insulating layer 127 are formed on the stacked first conductive layer 121 and interlayer insulating layer 122 in the second stack unit 120. The silicide layer 128 is formed on the upper surface of the ceiling portion of the n− type semiconductor layer 124 with the reversed U-shaped cross section.

For example, the silicon oxide ($SiO_2$) film is used for the interlayer insulating layer 126. The BPSG (Boron Phosphorus Silicate Glass), the BSG (Boron Silicate Glass), and the PSG (Phosphorus Silicate Glass) including boron or phosphorus in the silicon oxide film may be used. For example, an aluminum oxide ($Al_2O_3$) film is used for the interlayer insulating layer 127. The silicide layer 128 covers the interlayer insulating layer 127.

The interlayer insulating layer 129 fills the peripheral space around the stacked first conductive layers 121 and the interlayer insulating layers 122, hence to insulation-separate itself from the other NAND cell unit.

A third stack unit 130 has an interlayer insulating layer 131 formed on the interlayer insulating layer 129. The third stack unit 130 has the contact plug layers 132 and 134 (the first contact plug layer and the second contact plug layer) provided in the interlayer insulating layer 131 and the wiring layers 133 and 135 (the first wiring layer and the second wiring layer) provided on the upper surfaces of the contact plug layers 132 and 134.

The contact plug layer 132 is formed to extend in the stacking direction. As shown in FIG. 2B, the contact plug layer 132 penetrates the interlayer insulating layers 131, 129, 119, and 118 and the gate insulating film 115 and reaches to the n+ type drain region 111 of the drain side selection transistor SDT.

The wiring layer 133 is formed in contact with the upper surface of the contact plug layer 132. The wiring layer 133 extends in an x direction shown in FIG. 2A and works as the above mentioned bit line BL.

The contact plug layer 134 extends in the stacking direction. As shown in FIG. 2B, the contact plug layer 134 penetrates the interlayer insulating layers 129, 119, and 118 and the gate insulating film 115 and reaches to the n+ type source region 114 of the source side selection transistor SST.

The wiring layer 135 is formed in contact with the upper surface of the contact plug layer 134. As shown in FIG. 2A, the wiring layer 135 is connected to the upper surface of a plurality of contact plug layers 134 aligned in the Y direction and works as the above mentioned source line SL (the second wiring layer).

The first stack unit 110, the second stack unit 120, and the third stack unit 130 forming the respective NAND cell units are insulation-separated by each insulating layer 150 formed therebetween.

(Manufacturing Process of Nonvolatile Semiconductor Memory Device According to Embodiment)

Next, the manufacturing process of the nonvolatile semiconductor memory device according to the embodiment will be described referring to FIGS. 3A to 17A and FIGS. 3B to 17B. FIGS. 3A to 17A are top views in the manufacturing process and FIGS. 3B to 17B are cross-sectional views taken along the line A-A' in the manufacturing process.

Figure 3A:
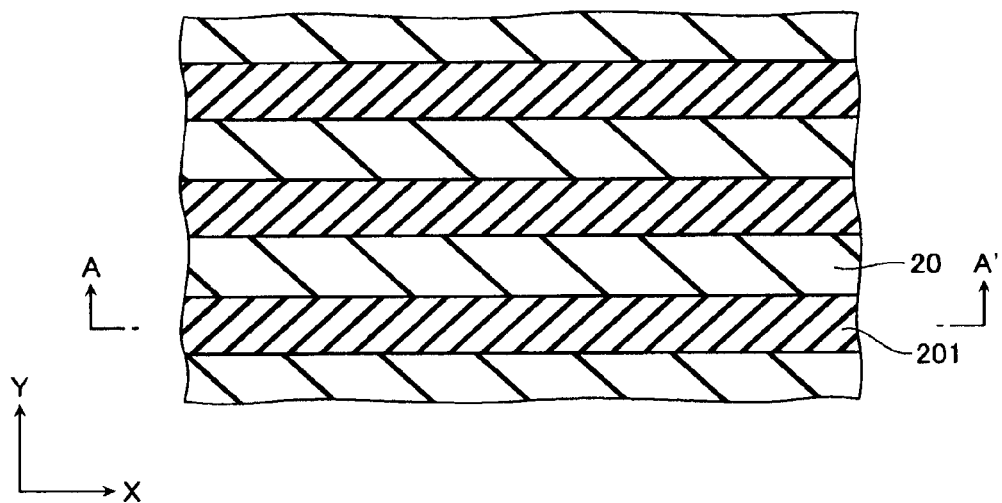
FIG. 3A is a top plan view showing a manufacturing process of the nonvolatile semiconductor memory device according to the embodiment of the invention.
Figure 3B:
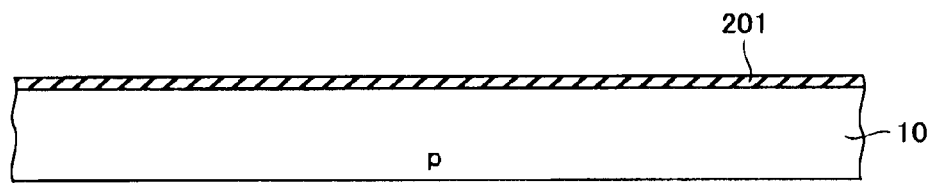
FIG. 3B is a cross-sectional view of A-A' in FIG. 3A showing the manufacturing process of the nonvolatile semiconductor memory device according to the embodiment of the invention.

As shown in FIG. 3A and FIG. 3B, the insulating film 201 is formed on the whole surface of the semiconductor substrate 10 (for example, the P− type silicon (Si) substrate). Then, the surface of the semiconductor substrate 10 is etched through anisotropic etching using an etching mask and a plurality of trenches are formed in the X direction. Next, by burying an insulating film into each trench, each isolation region 20 of STI (Shallow Trench Isolation) structure is formed. The insulating film 201 becomes the gate insulating film 115 after the following process.

Figure 4A:
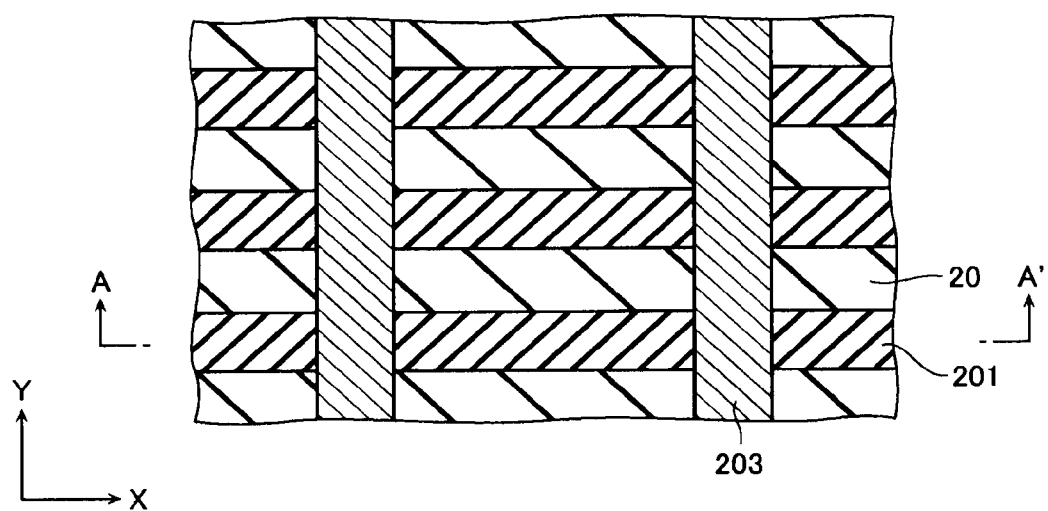
FIG. 4A is a top plan view showing the manufacturing process of the nonvolatile semiconductor memory device according to the embodiment of the invention.
Figure 4B:
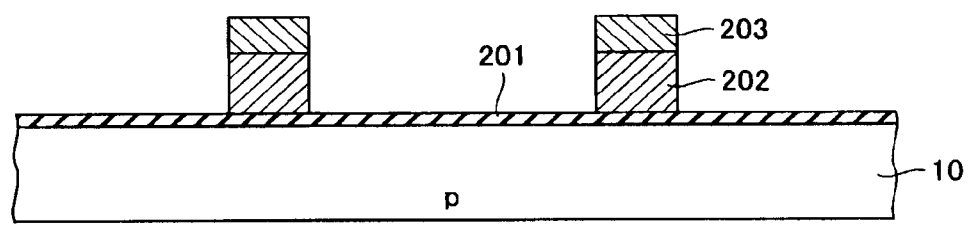
FIG. 4B is a cross-sectional view of A-A' in FIG. 4A showing the manufacturing process of the nonvolatile semiconductor memory device according to the embodiment of the invention.

As shown in FIGS. 4A and 4B, a conductive film is deposited on the whole surface. The conductive film is etched into a certain shape (extending in Y direction and having a certain interval each other in X direction as shown in FIG. 4A) to form gate electrodes 202 on the semiconductor substrate 10. The silicide layer 203 is formed on the gate electrode 202. After the process described later, the gate electrode 202 will be the gate electrode 116 of the drain side selection transistor SDT and the source side selection transistor SST. After the process described later, the silicide layer 203 will be the silicide layer 117.

Figure 5A:
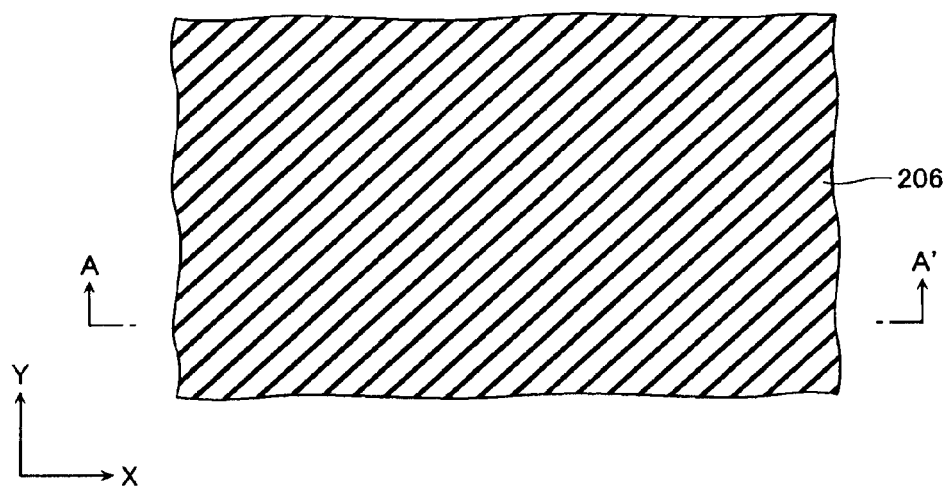
FIG. 5A is a top plan view showing the manufacturing process of the nonvolatile semiconductor memory device according to the embodiment of the invention.
Figure 5B:
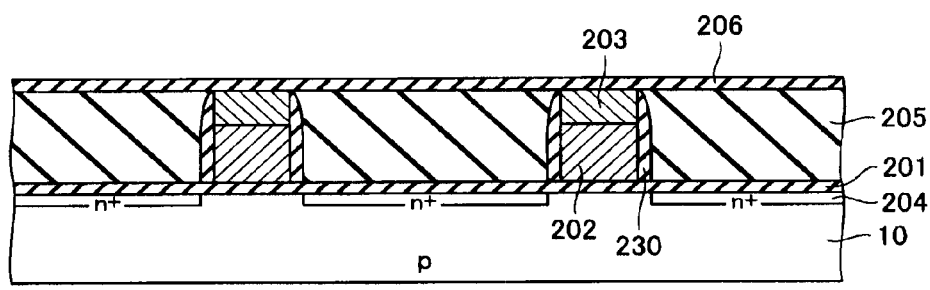
FIG. 5B is a cross-sectional view of A-A' in FIG. 5A showing the manufacturing process of the nonvolatile semiconductor memory device of the embodiment of the invention.

As shown in FIGS. 5A and 5B, after the insulating film 230 is formed on the side wall of the gate electrode 202, channel ion implantation is performed to form the n+ type semiconductor region 204 on the semiconductor substrate 10. After that, the interlayer insulating layer 205 is deposited and then it is planarized by the CMP (Chemical Mechanical Polishing). An interlayer insulating layer 206 formed, for example, of a silicon nitride (SiN) film that will be an etching stopper film at a time of the memory cell processing described later is deposited on the layer 205. After the process described later, the n+ type semiconductor region 204 will be the n+ type drain regions 111 and 113 and the n+ type source regions 112 and 114 of the selection transistors SDT and SST. The interlayer insulating layers 205 and 206 will be the interlayer insulating layers 118 and 119 after the process described later. At a time of forming the drain side selection transistor SDT and the source side selection transistor SST, peripheral circuits outside of the cell array region may be formed at the same time.

Figure 6A:
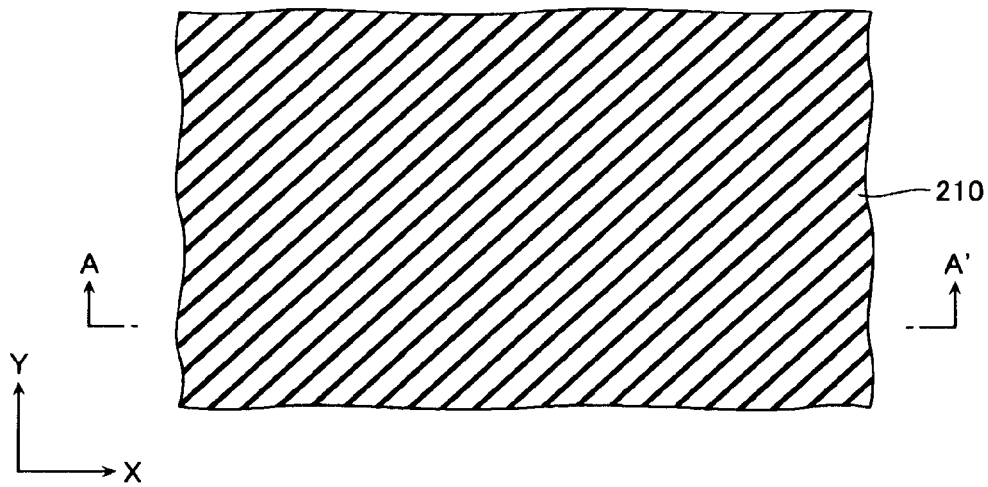
FIG. 6A is a top plan view showing the manufacturing process of the nonvolatile semiconductor memory device according to the embodiment of the invention.
Figure 6B:
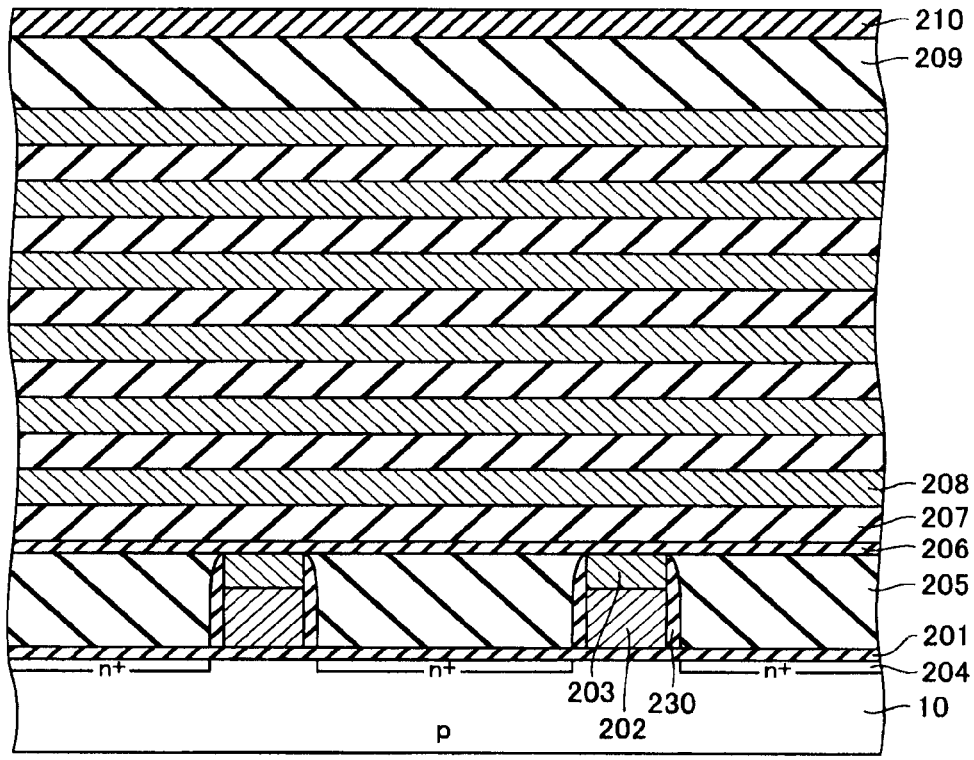
FIG. 6B is a cross-sectional view of A-A' in FIG. 6A showing the manufacturing process of the nonvolatile semiconductor memory device according to the embodiment of the invention.

As shown in FIGS. 6A and 6B, the interlayer insulating layer 207 and the first conductive layer 208 are alternately deposited. The interlayer insulating layer 209 is deposited thereon. Further, the interlayer insulating layer 210, for example, formed of the aluminum oxide ($Al_2O_3$) film that is an etching stopper film at a time of the processing described later, is deposited. After the process described later, each interlayer insulating layer 207 will be the interlayer insulating layer 122. The respective first conductive layers 208 become the first conductive layers 121a to 121l working as the control gates CG0 to CG11. The interlayer insulating layer 209 will be the interlayer insulating layer 126 after the process described below. The interlayer insulating layer 210 will be the interlayer insulating layer 127 after the process described below.

For example, polysilicon is used as the first conductive layer 208 in the embodiment. In order to make the resistance of the control gate CG lower, tungsten (W), aluminum (Al), copper (Cu) may be used. For example, the silicon oxide ($SiO_2$) film is used as the interlayer insulating layer 207 and the interlayer insulating layer 209. The BPSG (Boron Phosphorus Silicate Glass), the BSG (Boron Silicate Glass), and the PSG (Phosphorus Silicate Glass) including the boron (B) or the phosphorus (P) in the silicon oxide film, may be used.

Figure 7A:
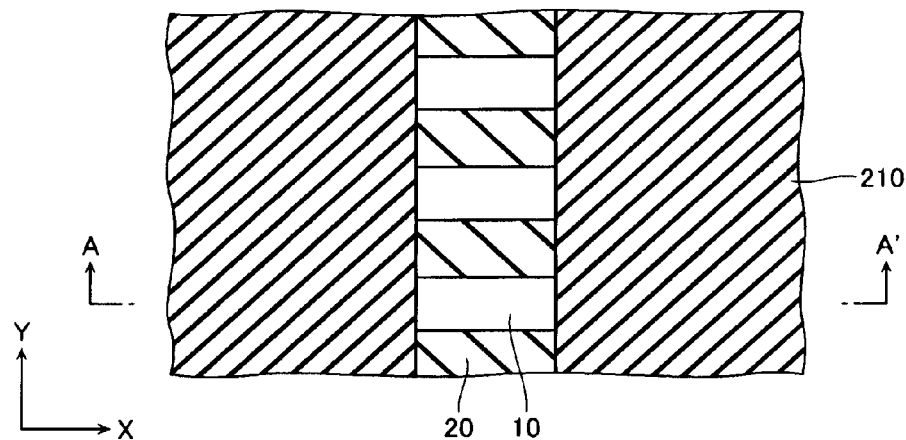
FIG. 7A is a top plan view showing the manufacturing process of the nonvolatile semiconductor memory device according to the embodiment of the invention.
Figure 7B:
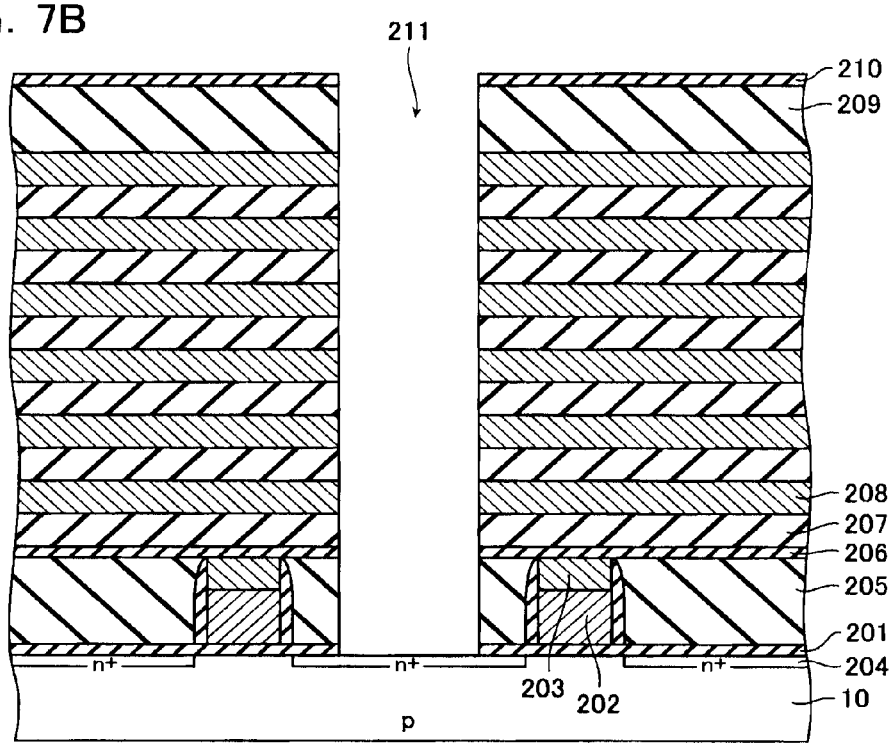
FIG. 7B is a cross-sectional view of A-A' in FIG. 7A showing the manufacturing process of the nonvolatile semiconductor memory device according to the embodiment of the invention.

As shown in FIGS. 7A and 7B, the interlayer insulating layer 210 is used as a mask material and the first conductive layer 208, the interlayer insulating layers 205, 206, 207, and 209, and the insulating film 201 are selectively etched by using the lithography method and the RIE (Reactive Ion Etching) method. Openings 211 are formed to extend in X direction and to have a certain distance in X direction shown in FIG. 7A and formed by piercing the stacked first conductive layer 208, interlayer insulating layers 205, 206, 207, and 209, and insulating film 201 in order to expose the upper surface of the semiconductor substrate 10. At the time, the interlayer insulating layer 206 is used as the stopper film, hence to assure the uniformity in the surface of the wafer.

Figure 8A:
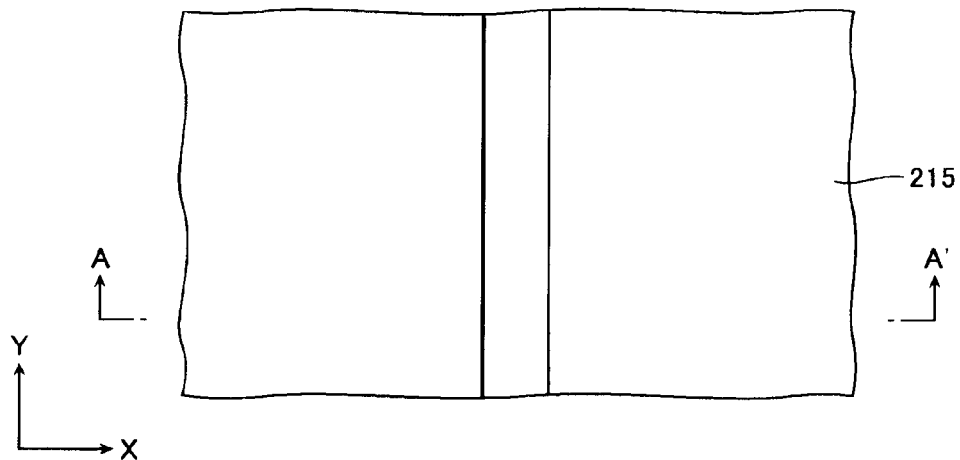
FIG. 8A is a top plan view showing the manufacturing process of the nonvolatile semiconductor memory device of the embodiment of the invention.
Figure 8B:
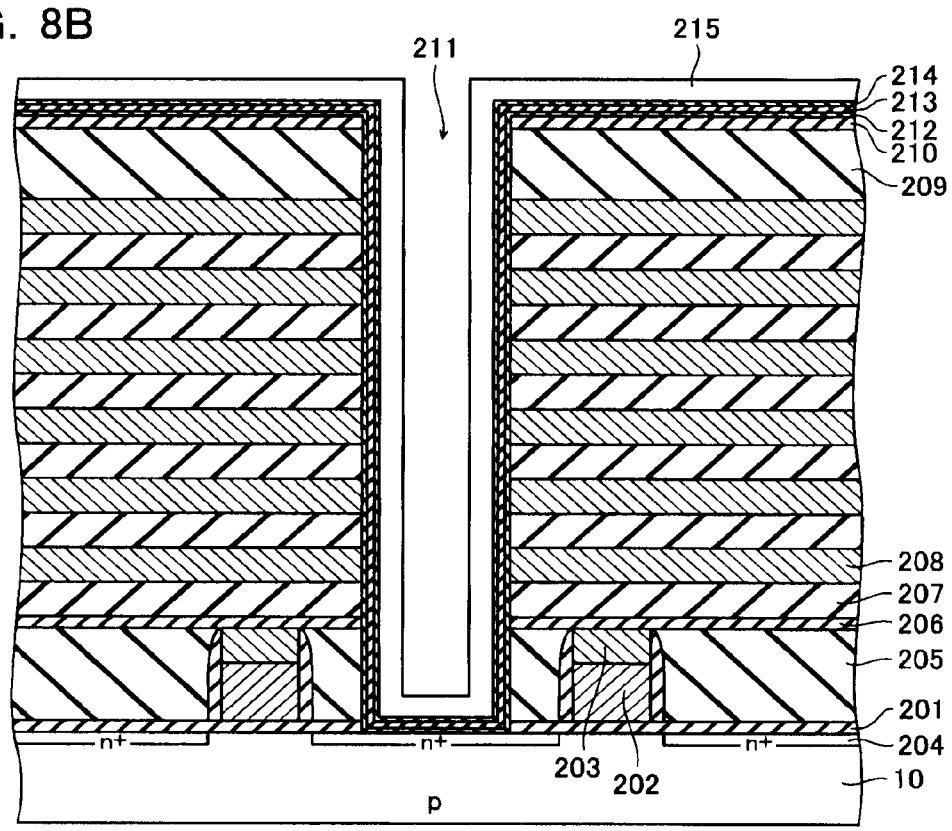
FIG. 8B is a cross-sectional view of A-A' in FIG. 8A showing the manufacturing process of the nonvolatile semiconductor memory device according to the embodiment of the invention.

As shown in FIGS. 8A and 8B, a silicon oxide film 212, a silicon nitride film 213, and a silicon oxide film 214 are deposited by turns on the side surface and the bottom surface of the opening 211 and on the interlayer insulating layer 210. Next, the n– type semiconductor layer 215 is deposited on the silicon oxide film 214. The amorphous silicon is deposited as the n– type semiconductor layer 215 and annealed for crystallization. The n– type impurity (phosphorus (P), arsenic (As) and so on) is introduced in the n– type semiconductor layer 215 so that the impurity concentration may be 1E19/$cm^3$ or less of comparatively low concentration. After the process described later, the silicon oxide film 212, the silicon nitride film 213, and the silicon oxide film 214 become the block insulating layer 123B, the charge storage layer 123C, and the tunnel insulating layer 123T. The n– type semiconductor layer 215 will be n– type semiconductor layer 124 after the process described later.

Figure 9A:
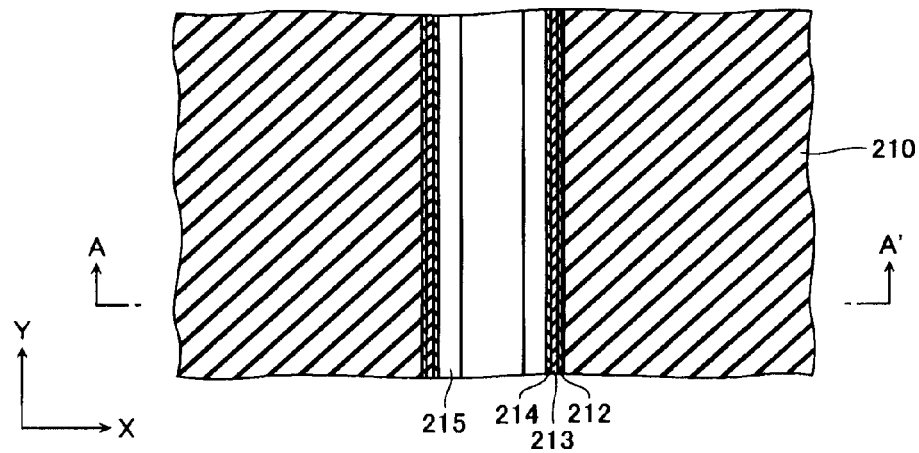
FIG. 9A is a top plan view showing the manufacturing process of the nonvolatile semiconductor memory device according to the embodiment of the invention.
Figure 9B:
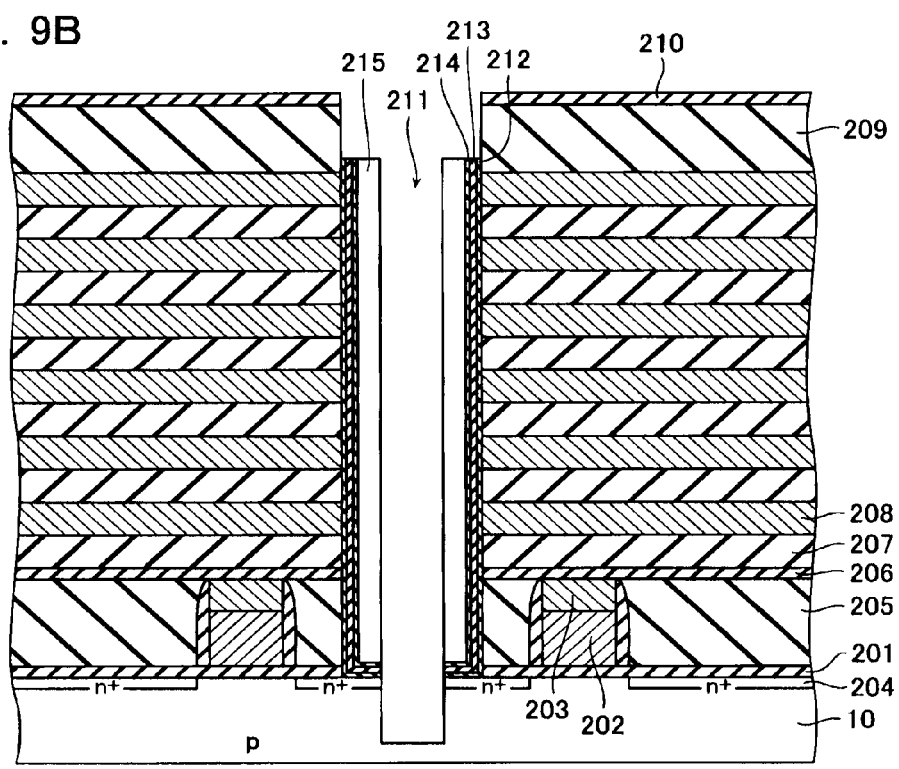
FIG. 9B is a cross-sectional view of A-A' in FIG. 9A showing the manufacturing process of the nonvolatile semiconductor memory device according to the embodiment of the invention.

As shown in FIGS. 9A and 9B, the silicon oxide film 212, the silicon nitride film 213, the silicon oxide film 214, and the n– type semiconductor layer 215 deposited on the interlayer insulating layer 210 and the semiconductor substrate 10 are eliminated by the etching. At the time, by etching the semiconductor substrate 10 with the drain side selection transistor SDT and the source side selection transistor SST formed, the drain side selection transistor SDT and the source side selection transistor SST can be isolated from each other. The silicon oxide film 212, the silicon nitride film 213, the silicon oxide film 214, and the n– type semiconductor layer 215 are etched only by the portion on the interlayer insulating layer 210 and on the bottom surface of the opening 211 and they are left without being etched by the portion in the side surface of the opening 211 (at least, left on the side surface of the first conductive layer 208 of the top layer) by adjustment of an etching condition. In addition, the isolation region 20 exposed by the opening 211 is etched at the same time.

Figure 10A:
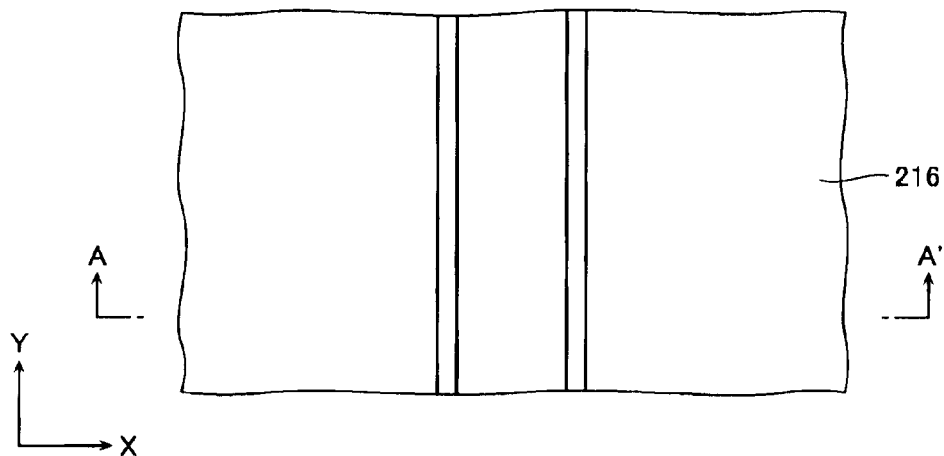
FIG. 10A is a top plan view showing the manufacturing process of the nonvolatile semiconductor memory device according to the embodiment of the invention.
Figure 10B:
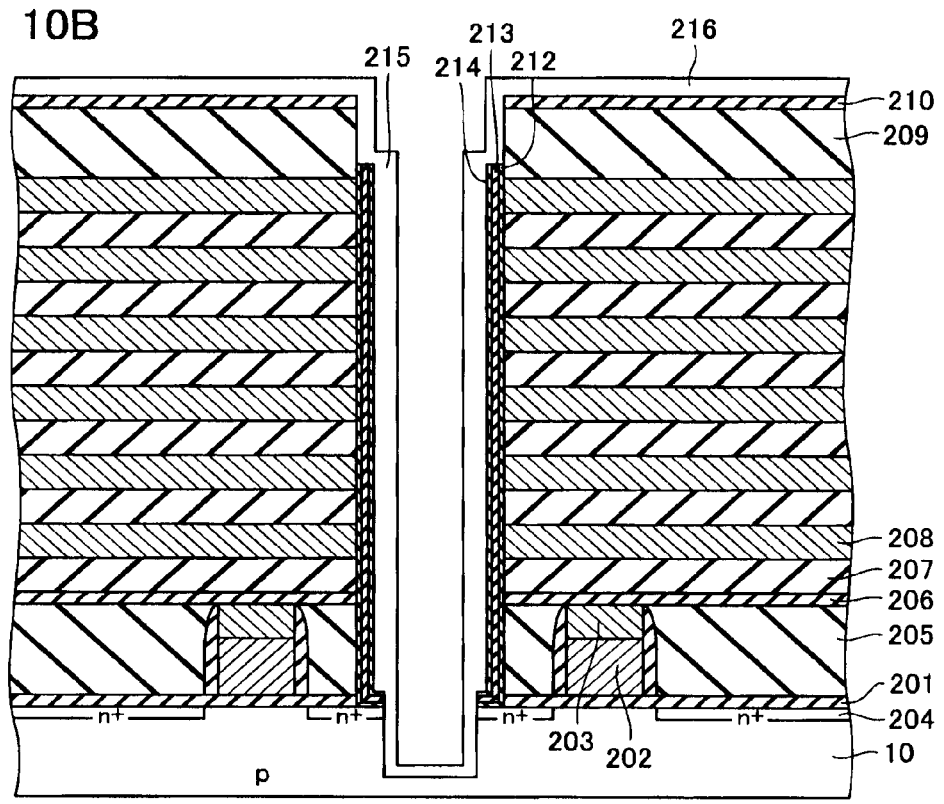
FIG. 10B is a cross-sectional view of A-A' in FIG. 10A showing the manufacturing process of the nonvolatile semiconductor memory device according to the embodiment of the invention.

As shown in FIGS. 10A and 10B, the n– type semiconductor layer 216 is deposited on the side surface and the bottom surface of the opening 211 and on the interlayer insulating layer 210. Therefore, the n– type semiconductor layer 216 can be connected to the n+ type semiconductor region 204 (the source region 112 and the drain region 113 of the drain side selection transistor SDT and the source side selection transistor SST). After the process described later, the n– type semiconductor layer 216 will be the n– type semiconductor layer 124.

Figure 11A:
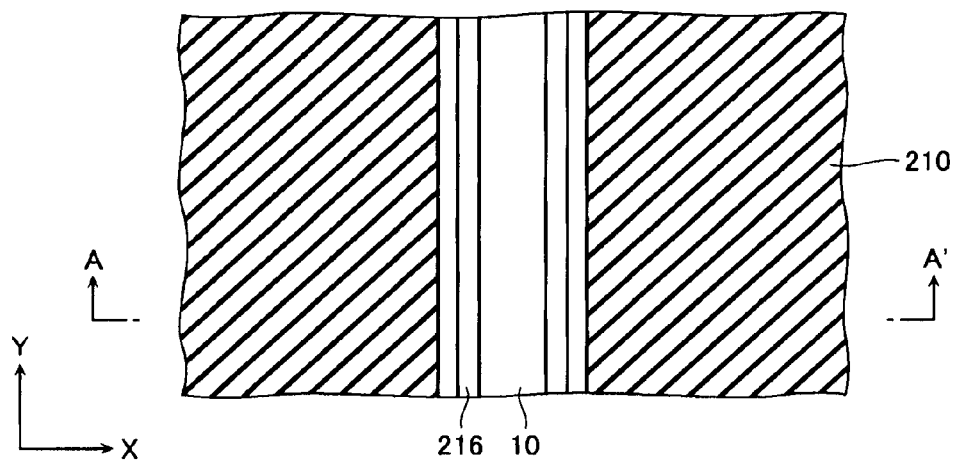
FIG. 11A is a top plan view showing the manufacturing process of the nonvolatile semiconductor memory device according to the embodiment of the invention.
Figure 11B:
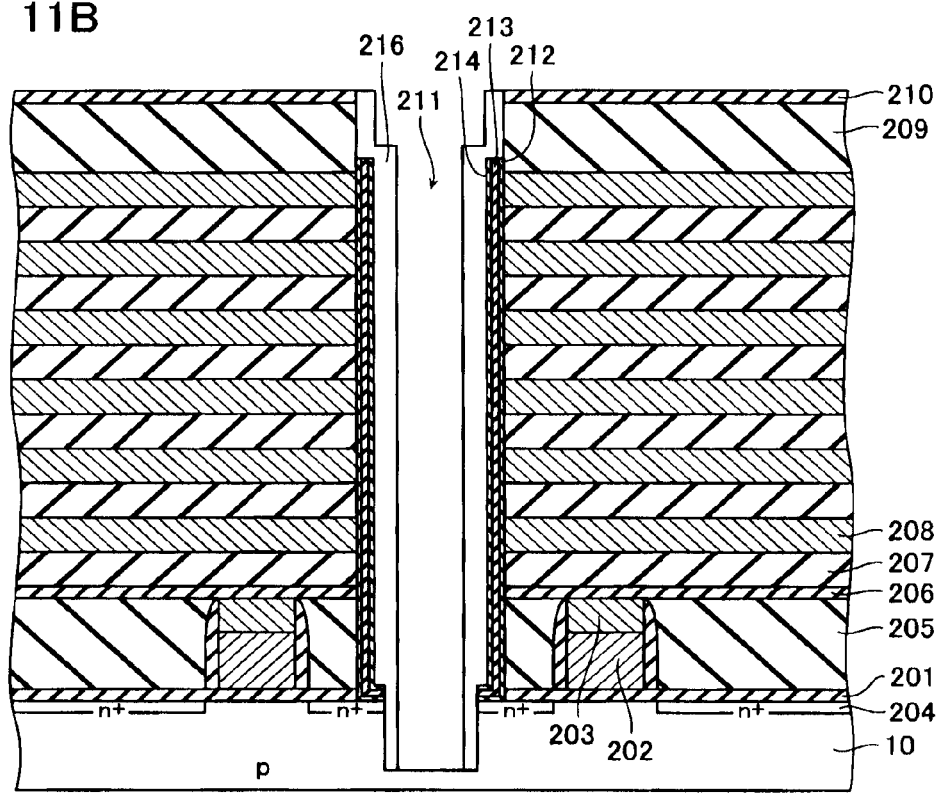
FIG. 11B is a cross-sectional view of A-A' in FIG. 11A showing the manufacturing process of the nonvolatile semiconductor memory device according to the embodiment of the invention.

As shown in FIGS. 11A and 11B, the n– type semiconductor layer 216 on the semiconductor substrate 10 and the interlayer insulating layer 210 are selectively eliminated to separate the n– type semiconductor layer 216 in the opening 211. Therefore, it is possible to isolate the drain side selection transistor SDT and the source side selection transistor SST. In order to ensure the electrical separation of the drain side selection transistor SDT and the source side selection transistor SST, for example, boron (B) may be injected, to make the lower portion of the opening 211 (trench T) into the p+ type.

Figure 12A:
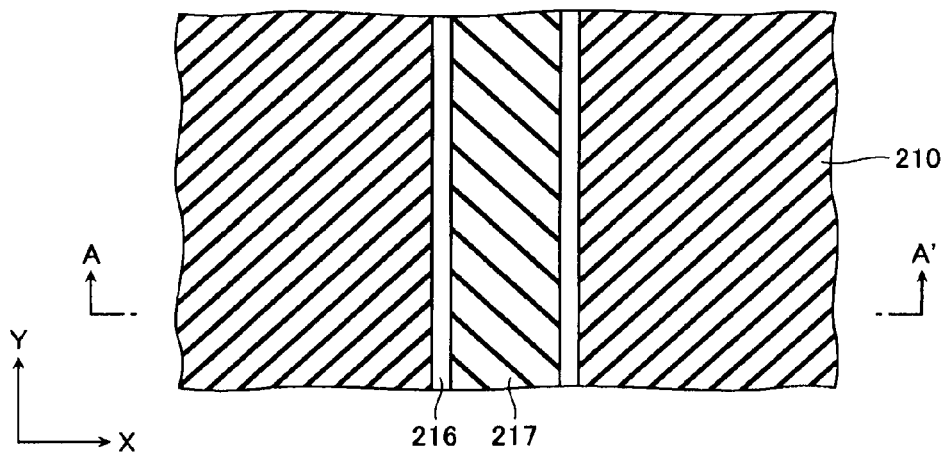
FIG. 12A is a top plan view showing the manufacturing process of the nonvolatile semiconductor memory device according to the embodiment of the invention.
Figure 12B:
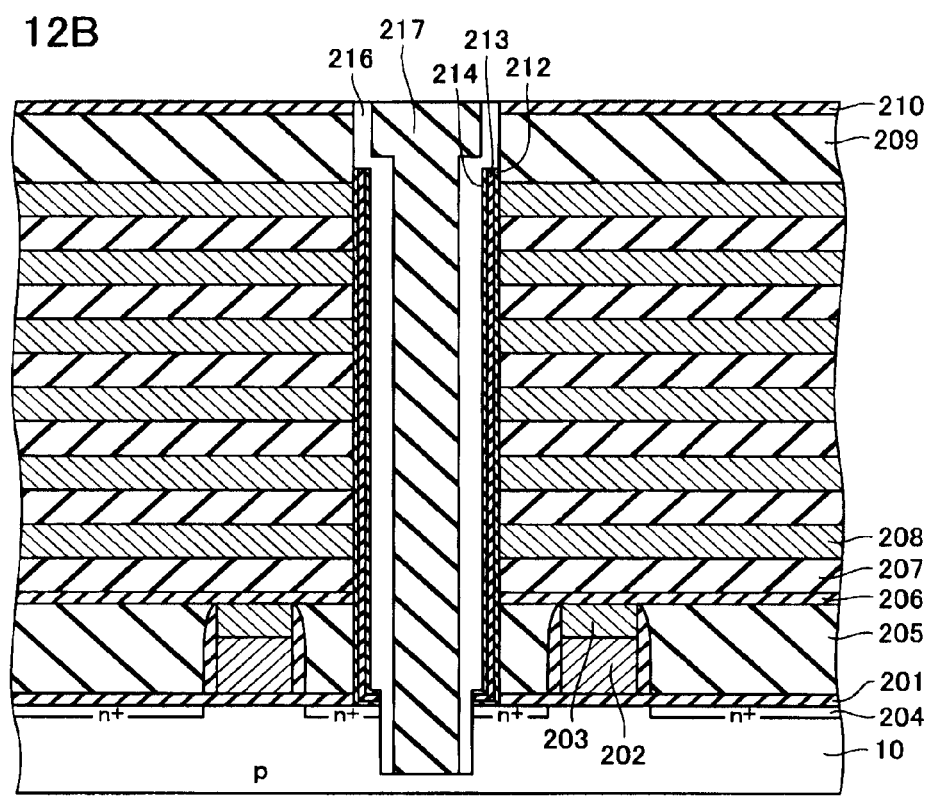
FIG. 12B is a cross-sectional view of A-A' in FIG. 12A showing the manufacturing process of the nonvolatile semiconductor memory device according to the embodiment of the invention.

As shown in FIGS. 12A and 12B, the insulating layer 217 is deposited to fill the opening 211. Thereafter, an upper surface of the insulating layer 217 is flattened by the CMP (Chemical Mechanical Polishing) method using the interlayer insulating layer 210 as stopper. After the process described later, the insulating layer 217 will be the insulating layer 140.

Figure 13A:
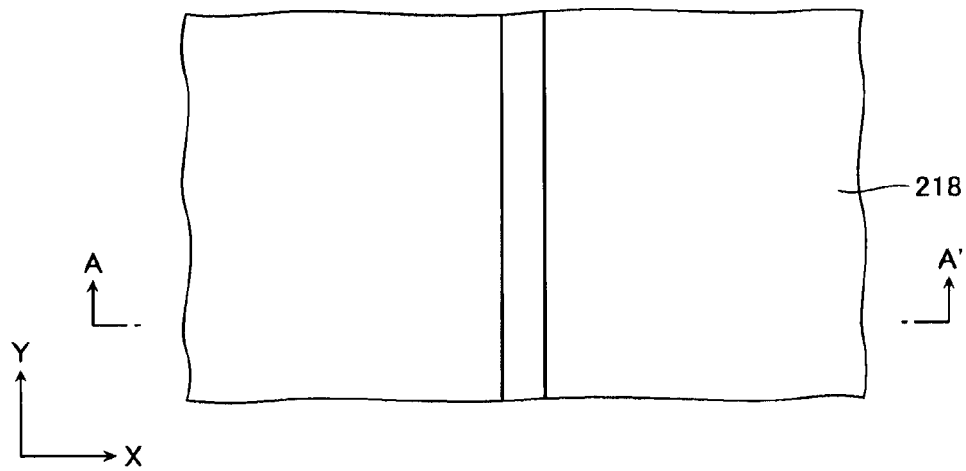
FIG. 13A is a top plan view showing the manufacturing process of the nonvolatile semiconductor memory device according to the embodiment of the invention.
Figure 13B:
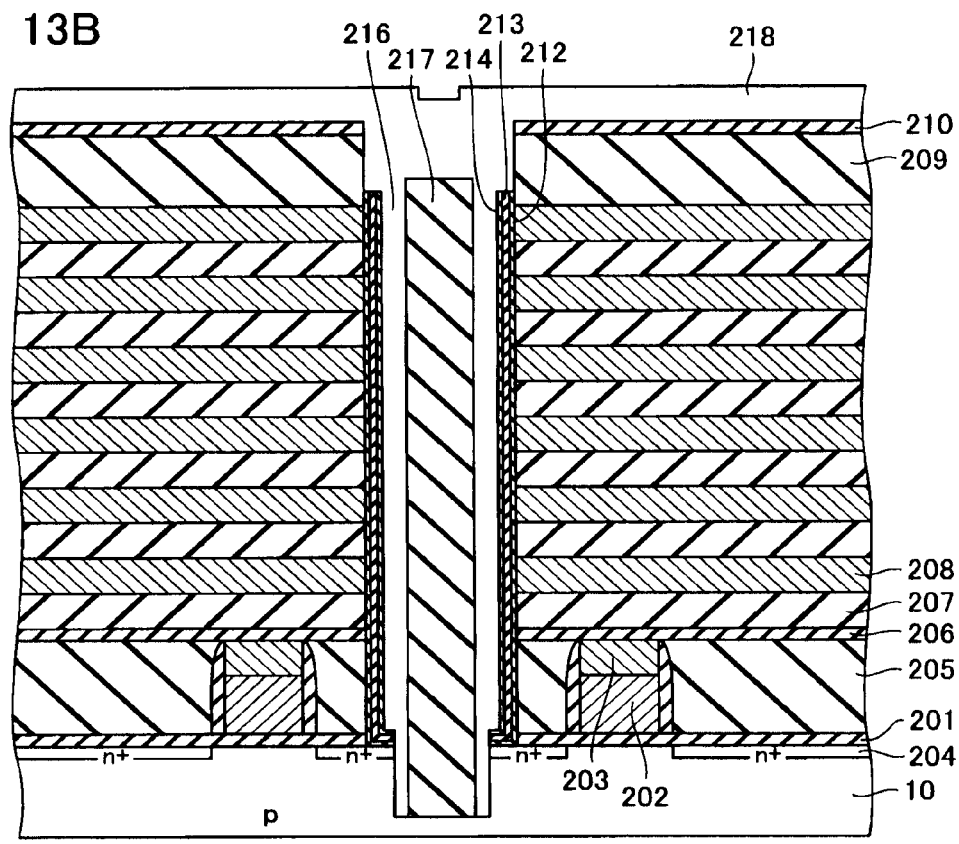
FIG. 13B is a cross-sectional view of A-A' in FIG. 13A showing the manufacturing process of the nonvolatile semiconductor memory device according to the embodiment of the invention.

As shown in FIGS. 13A and 13B, after the insulating layer 217 is etched back, the n– type semiconductor layer 218 is deposited on the insulating layer 217 and on the interlayer insulating layer 210. Here, the upper surface of the insulating layer 217 may be higher than the uppermost first conductive layer 208 by etching. After the process described later, the n– type semiconductor layer 218 will be the ceiling portion connecting the upper ends of a pair of facing n– type semiconductor layers 124 and the silicide layer 128.

Figure 14A:
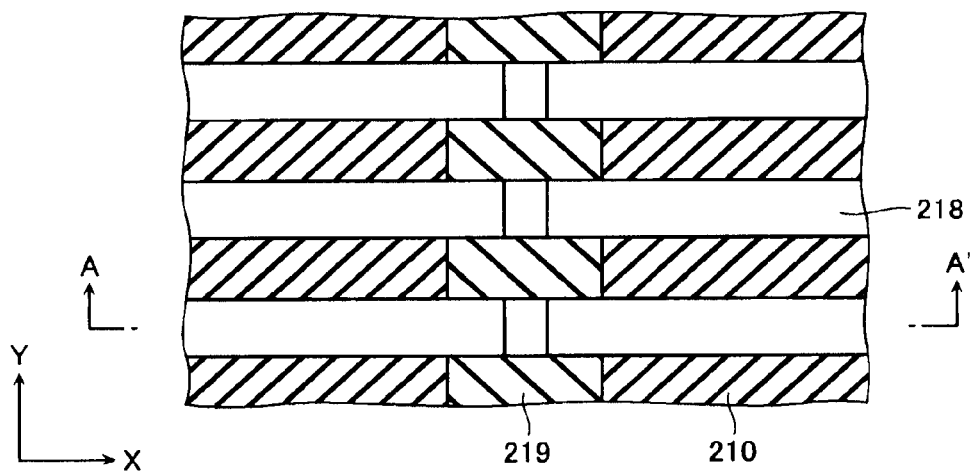
FIG. 14A is a top plan view showing the manufacturing process of the nonvolatile semiconductor memory device according to the embodiment of the invention.
Figure 14B:
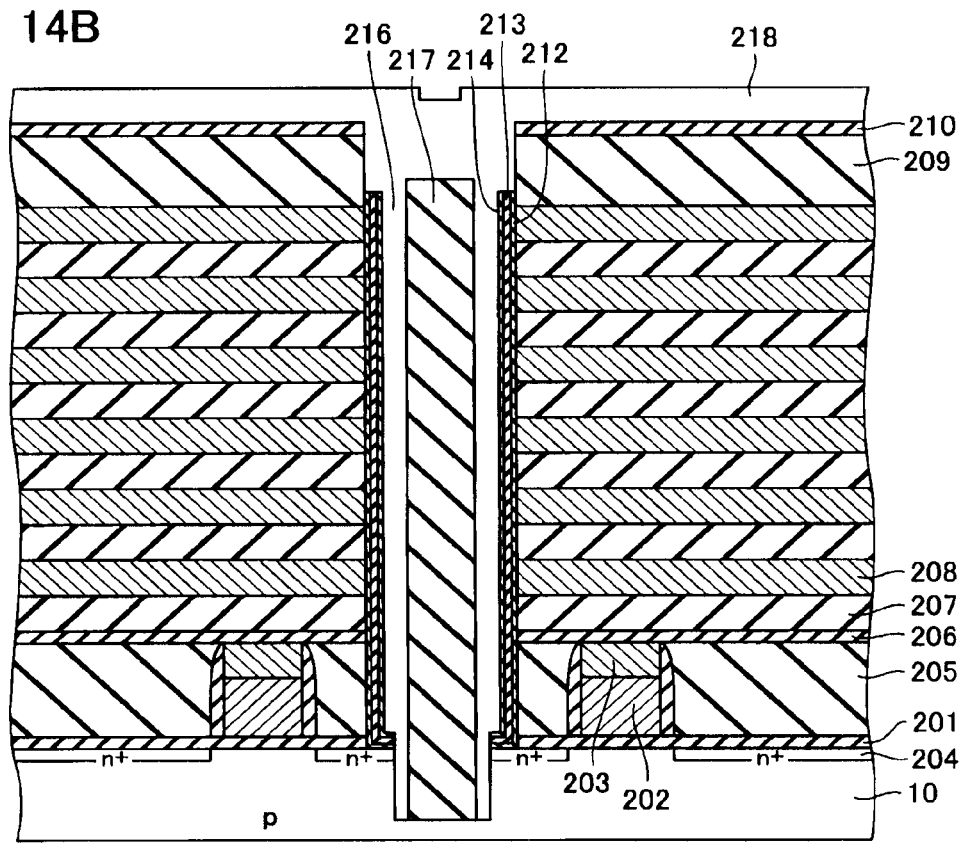
FIG. 14B is a cross-sectional view of A-A' in FIG. 14A showing the manufacturing process of the nonvolatile semiconductor memory device according to the embodiment of the invention.

As shown in FIGS. 14A and 14B, in order to electrically separate it into a plurality of units, the interlayer insulating layer 210 is used as the mask material, to etch and eliminate the n– type semiconductor layers 216 and 218, the silicon oxide film 212, the silicon nitride film 213, the silicon oxide film 214, and the insulating layer 217. Therefore, the respective NAND cell units are separated from each other. The etching is performed until it reaches to the semiconductor substrate 10 in order to separate the n– type semiconductor layers 216 and 218 as the channel. The insulating layer 219 is deposited on the opening where the n– type semiconductor layers 216 and 218, the silicon oxide film 212, the silicon nitride film 213, the silicon oxide film 214, and the insulating layer 217 are eliminated, to flatten the surface. After the process described later, the insulating layer 219 will be the insulating layer 150.

Figure 15A:
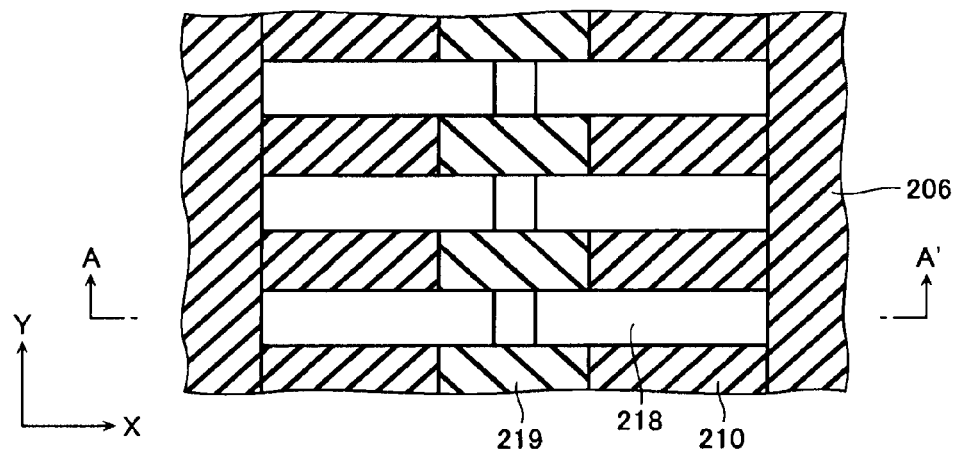
FIG. 15A is a top plan view showing the manufacturing process of the nonvolatile semiconductor memory device according to the embodiment of the invention.
Figure 15B:
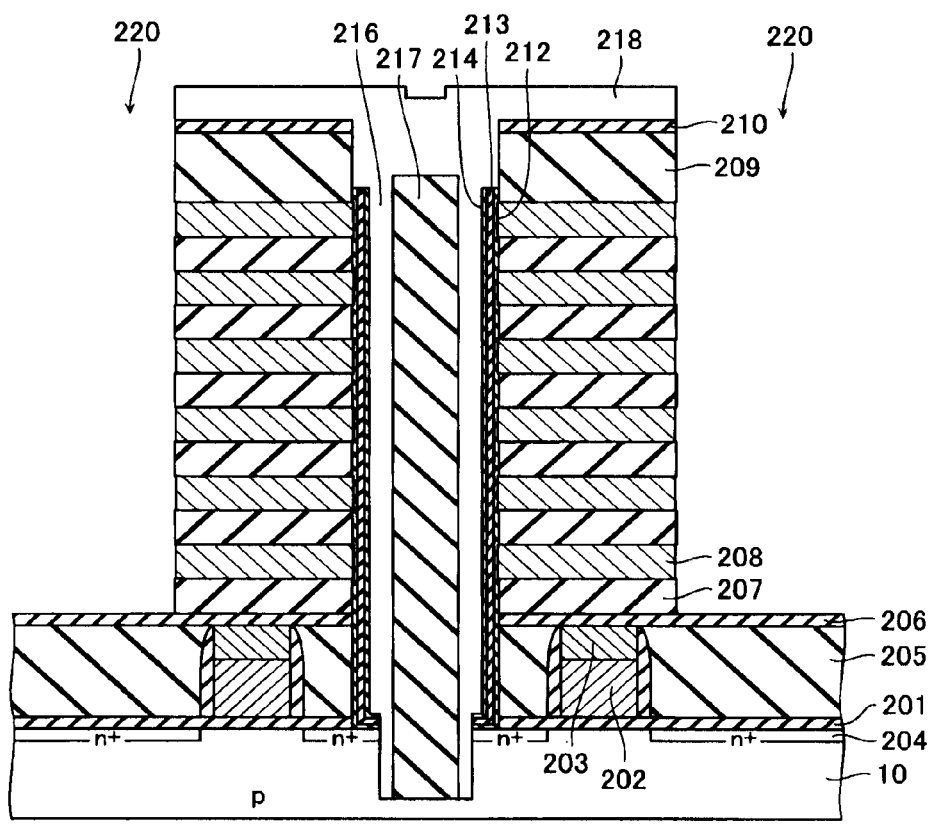
FIG. 15B is a cross-sectional view of A-A' in FIG. 15A showing the manufacturing process of the nonvolatile semiconductor memory device according to the embodiment of the invention.

As shown in FIGS. 15A and 15B, the first conductive layer 208 and the interlayer insulating layers 207, 209, and 210 opposite to the n– type semiconductor layer 216 are selectively eliminated. An opening 220 is formed to expose the end portions of the first conductive layer 208 and the interlayer insulating layers 207, 209, and 210 opposite to the n– type semiconductor layer 216 in the x direction.

Figure 16A:
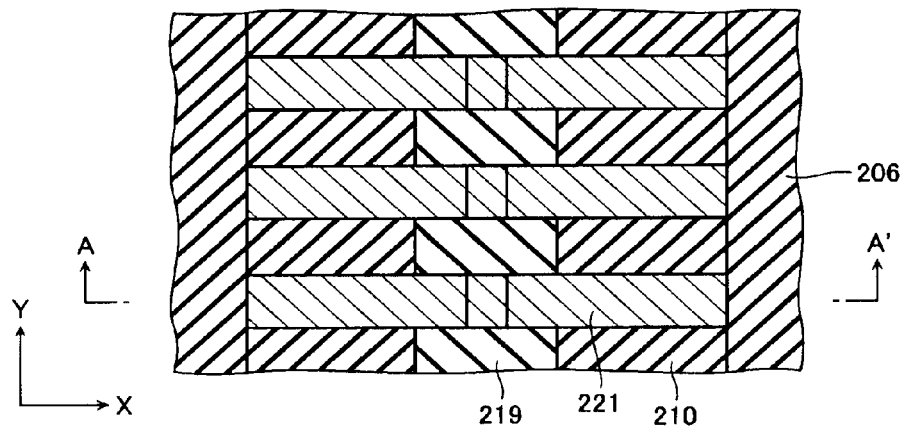
FIG. 16A is a top plan view showing the manufacturing process of the nonvolatile semiconductor memory device according to the embodiment of the invention.
Figure 16B:
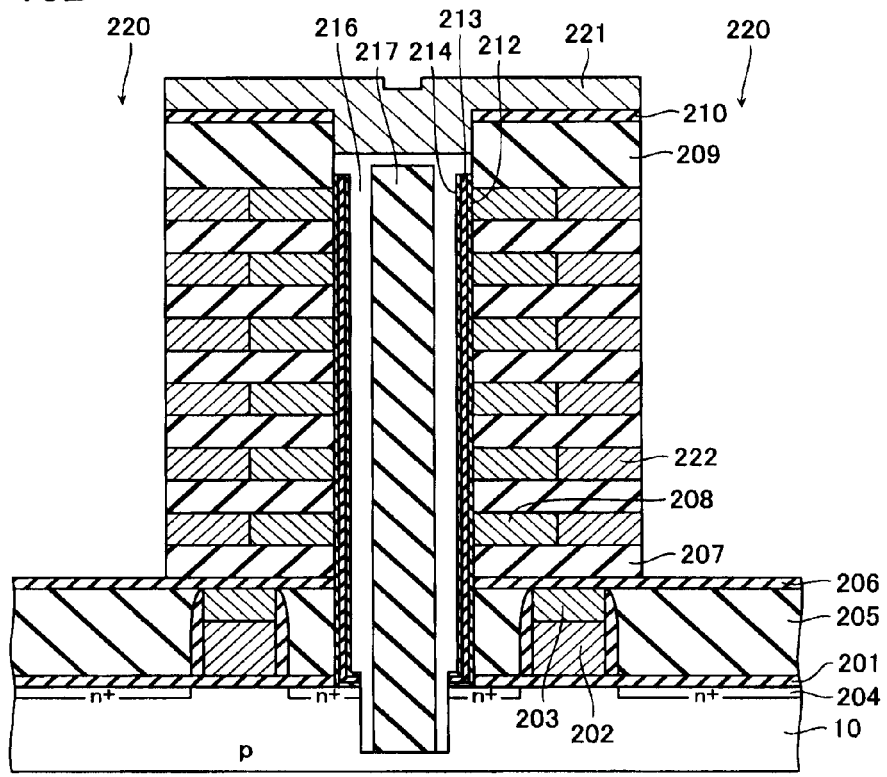
FIG. 16B is a cross-sectional view of A-A' in FIG. 16A showing the manufacturing process of the nonvolatile semiconductor memory device according to the embodiment of the invention.

As shown in FIGS. 16A and 16B, the exposed upper portion of the n– type semiconductor layer 218 and the exposed end portions of the respective first conductive layers 208 in the x direction are silicided according to the salicide method. Therefore, the silicide layers 221 and 222 are formed on the upper portion of the n− type semiconductor layer 218 and the end portions of the respective first conductive layers 208. After the process described later, the silicide layers 221 and 222 will be the silicide layers 128 and 125.

Figure 17A:
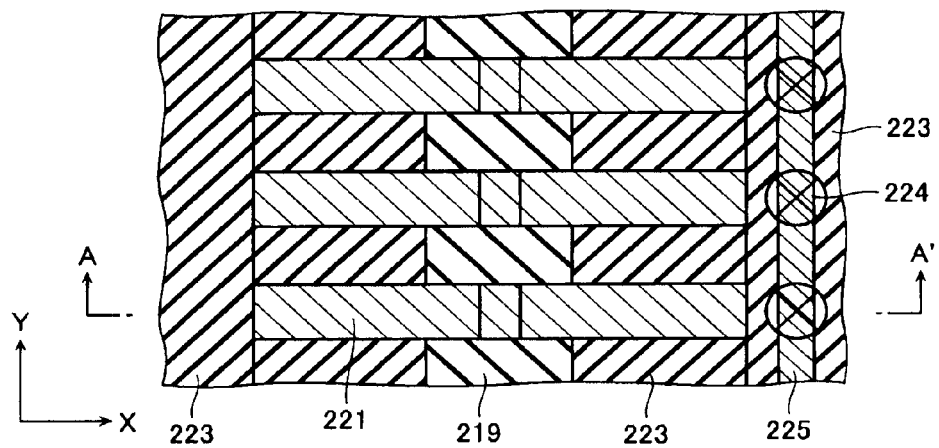
FIG. 17A is a top plan view showing the manufacturing process of the nonvolatile semiconductor memory device of the embodiment of the invention.
Figure 17B:
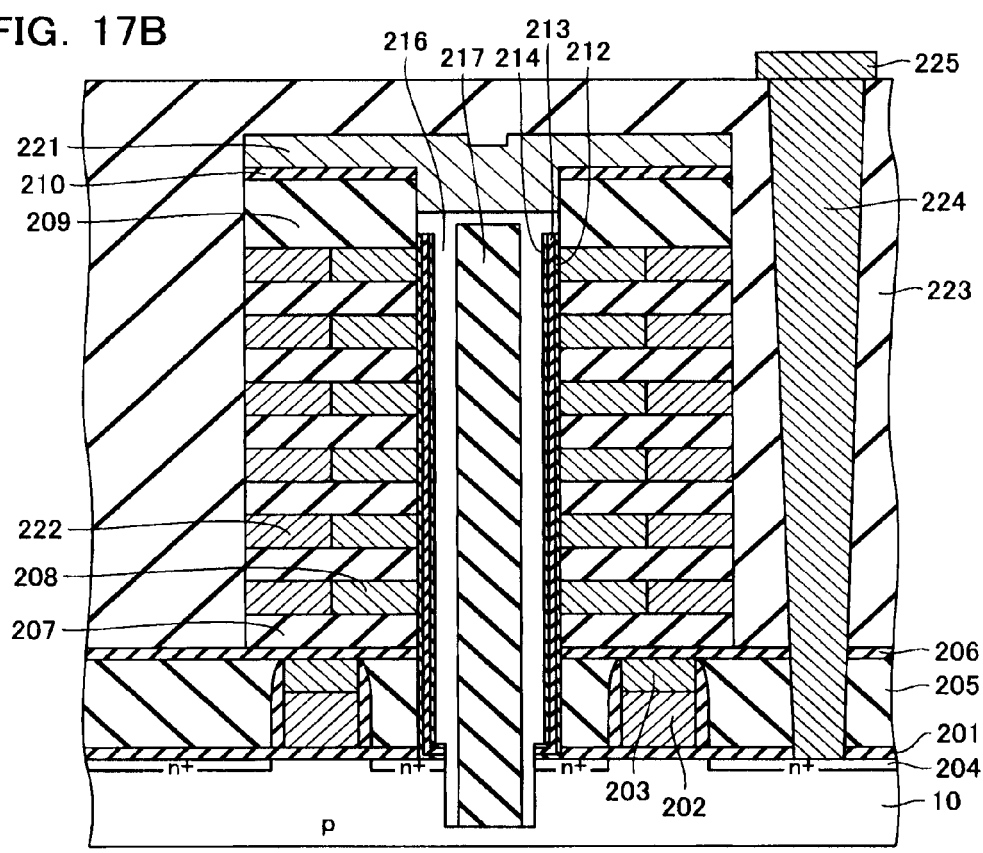
FIG. 17B is a cross-sectional view of A-A' in FIG. 17A showing the manufacturing process of the nonvolatile semiconductor memory device according to the embodiment of the invention.

As shown in FIGS. 17A and 17B, an interlayer insulating layer 223 is buried in the opening 220. A contact hole is formed through from the upper surface of the interlayer insulating film 223 to the n+ type semiconductor layer 204 that is the source region of the source side selection transistor SST. The conductive material is buried in the contact hole to form a contact plug layer 224. Then, a wiring layer 225 connected to the upper surface of a plurality of contact plug layers 224 aligned in the Y direction is formed on the interlayer insulating layer 223. After the process described later, the interlayer insulating layer 223 will be the interlayer insulating layer 129. The contact plug layer 224 will be the contact plug layer 134 after the processing described later. The wiring layer 225 will be the wiring layer 135 after the process described later.

Thereafter, the interlayer insulating layer is deposited on the interlayer insulating layer 223. The contact hole is formed through from the upper surface of the interlayer insulating film to the n+ type semiconductor layer 204 that is the drain region of the drain side selection transistor SDT. The conductive material is buried in the contact hole to form a contact plug layer. Then, the wiring layer connected to the upper surfaces of the contact plug layers aligned in the x direction is formed on the interlayer insulating layer, thereby making it possible to form the nonvolatile semiconductor memory device shown in FIGS. 2A and 2B.

(Effect of Nonvolatile Semiconductor Memory Device According to Embodiment)

Next, effects of the nonvolatile semiconductor memory device according to the embodiment will be described. Since the memory cells MC are of the vertical type and stacked in the nonvolatile semiconductor memory device according to the embodiment, the size of the NAND-type flash memory can be reduced.

According to the embodiment, both the drain side selection transistor SDT and the source side selection transistor SST can be formed on the semiconductor substrate 10. As described in JP-A No. 2007-180389, one or both of the selection transistors have the channel region of the amorphous silicon layer, in the NAND-type flash memory with the memory cells MC stacked vertically. While, in the nonvolatile semiconductor memory device according to the embodiment, each of the drain side selection transistor SDT and the source side selection transistor SST has the channel region on the semiconductor substrate 10, the single crystal silicon substrate. Therefore, the drain side selection transistor SDT and the source side selection transistor SST of the embodiment are superior to the selection transistor having the channel region of the polycrystal silicon and the microcrystal silicon in the cut off characteristics, the on-current and the operation speed. In other words, according to the embodiment, the nonvolatile semiconductor memory device can have a selection transistor having a good cut off characteristics and good operation speed.

Figure 18:
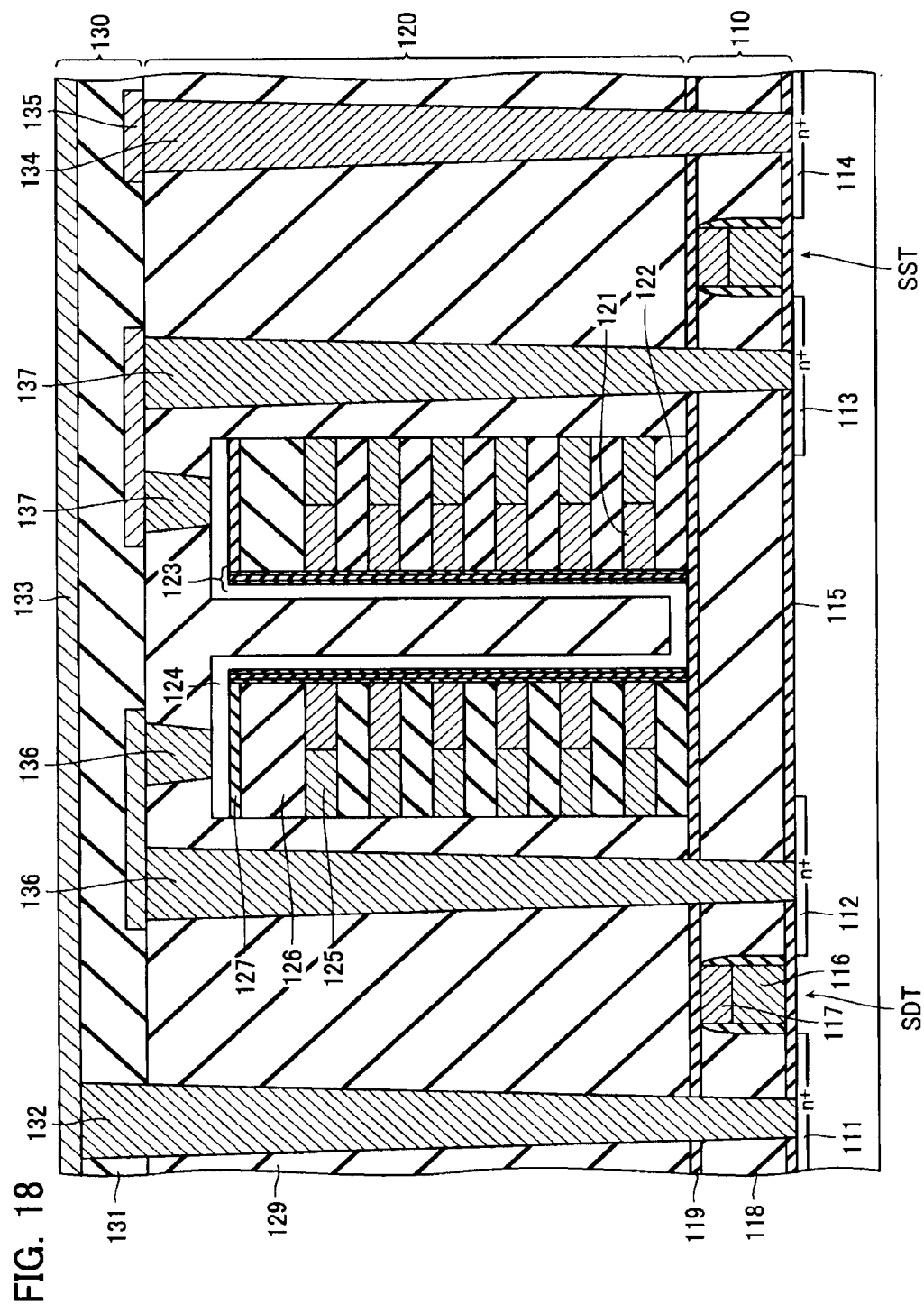
FIG. 18 is a cross-sectional view showing a concrete constitution of a modified example of the nonvolatile semiconductor memory device according to the embodiment of the invention.

As mentioned above, although one embodiment of the nonvolatile semiconductor memory device has been described, the invention is not limited to the above embodiment but various modifications, addition, and replacement are possible within the range not departing from the spirit of the invention. Although the n− type semiconductor layer 124 has an inverted U-shape in the above embodiment, the n− type semiconductor layer 124 may be formed into a U-shape and the selection transistors SDT and SST may be connected to the n− type semiconductor layer 124 via the contact plug layers 136 and 137 as shown in FIG. 18.

What is claimed is:

1. A nonvolatile semiconductor memory device having a plurality of NAND cell units formed of a plurality of electrically rewritable memory cells connected in series and a first selection transistor and a second selection transistor connected to both ends of the memory cells, respectively,
   the NAND cell unit being formed by connecting a plurality of memory cells in a vertical stacking direction, each of the memory cells having a channel region formed in a direction vertical to a surface of a substrate,
   the first selection transistor and the second selection transistor being formed on the surface of the substrate,
   the channel regions of the memory cells being formed by a first semiconductor layer formed so as to extend in the vertical stacking direction with one end connected to a diffusion layer of the first selection transistor and the other end connected to a diffusion layer of the second selection transistor, and
   the first semiconductor layer having an inverted U-shaped cross sectional shape in a way of turning back at an uppermost portion in the vertical stacking direction and contacting the first selection transistor and the second selection transistor at a lower portion.

2. The nonvolatile semiconductor memory device according to claim 1, further comprising
   a buried insulating film which fills the inverted U-shaped portion of the first semiconductor layer.

3. The nonvolatile semiconductor memory device according to claim 1, wherein
   the first selection transistor and the second selection transistor are planar-type transistor with the diffusion layer on the semiconductor substrate.

4. The nonvolatile semiconductor memory device according to claim 2, wherein
   the first selection transistor and the second selection transistor are isolated by the buried insulating film filling the inverted U-shaped portion.

5. The nonvolatile semiconductor memory device according to claim 1, further comprising
   a first contact plug layer connected to the other diffusion layer of the first selection transistor;
   a first wiring layer formed in contact with the first contact plug layer, extending in a first direction orthogonal to the stacking direction;
   a second contact plug layer connected to the other diffusion layer of the second selection transistor; and
   a second wiring layer formed in contact with the second contact plug layer, extending in a second direction orthogonal to the first direction and the stacking direction.

6. The nonvolatile semiconductor memory device according to claim 1, wherein
   the first semiconductor layer is formed of partially silicided polysilicon.

* * * * *